(12) United States Patent
Paillet et al.

(10) Patent No.: US 7,199,665 B2
(45) Date of Patent: Apr. 3, 2007

(54) SINGLE TO DUAL NON-OVERLAPPING CONVERTER

(75) Inventors: Fabrice Paillet, Hillsboro, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 92 days.

(21) Appl. No.: 10/954,127

(22) Filed: Sep. 29, 2004

(65) Prior Publication Data

US 2006/0066462 A1    Mar. 30, 2006

(51) Int. Cl.
*H03F 3/04* (2006.01)

(52) U.S. Cl. ............... 330/301; 330/310; 330/275; 330/280; 333/25; 333/138; 333/139

(58) Field of Classification Search ........... 330/301, 330/310, 275, 280; 333/25, 138, 139
See application file for complete search history.

(56) References Cited

U.S. PATENT DOCUMENTS 3,148,336 A * 9/1964 Milford ............... 330/311
4,994,755 A * 2/1991 Titus et al. ............ 330/54

* cited by examiner

*Primary Examiner*—Michael B. Shingleton
(74) *Attorney, Agent, or Firm*—Schwegman, Lundberg, Woessner & Kluth, P.A.

(57) ABSTRACT

A converter includes an input circuit to receive a single-ended input signal to generate a number of control signals. The control signals have a delay different from one another relative to the single-ended input signal. The converter also includes a first output circuit and a second output circuit. The first output circuit responds to the control signals to generate a first output signal. The second output circuit responds to the control signals to generate a second output signal. The first and second output signals are non-overlapping and form a complimentary signal pair.

27 Claims, 8 Drawing Sheets

US 7,199,665 B2

SINGLE TO DUAL NON-OVERLAPPING CONVERTER

FIELD

Embodiments of the present invention relate to signal generation in electronic circuits.

BACKGROUND

Electronic circuits use signals to perform functions. Some circuits use a single signal for a function. Some other circuits use two signals as a complementary signal pair for other functions in which one of the two signals is an inverted version of the other signal.

An inverter is usually used to generate an inverted signal (inverted version) of an input signal. The inverter has a time delay. Thus, the inverted signal generated by the inverter has a delay relative to the original input signal. In some cases, the delay caused by the inverter is negligible for some function. Hence, in some cases, the inverted signal generated by the inverter and the original input signal are used together as the complementary signal pair. However, in cases where synchronization between the original input signal and the inverted signal is needed, the inverted signal and the original input signal are unsuitable.

DESCRIPTION OF EMBODIMENTS

Figure 1:
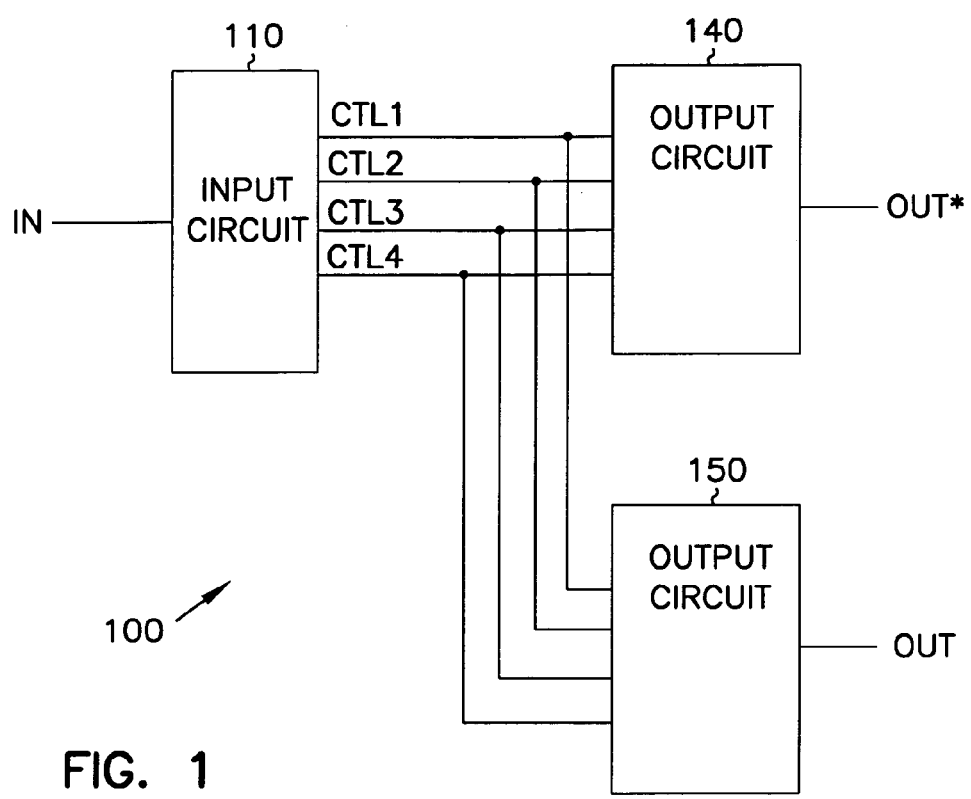
FIG. 1 shows a converter according to embodiments of the invention.

The following description and the drawings illustrate specific embodiments of the invention sufficiently to enable those skilled in the art to practice the embodiments of the invention. Other embodiments may incorporate structural, logical, electrical, process, and other changes. In the drawings, like features or like numerals describe substantially similar components throughout the several views. Examples merely typify possible variations. Portions and features of some embodiments may be included in or substituted for those of others. The scope of the invention encompasses the claims and all available equivalents.

FIG. 1 shows a converter according to embodiments of the invention. Converter 100 includes an input circuit 110, and output circuits 140 and 150. Input circuit 110 receives an input signal IN and generates a number of staged delay control signals CTL1, CTL2, CTL3, and CTL4. The IN signal is a single-ended signal. The CTL1, CTL2, CTL3, and CTL4 signals are staged delay staged control signals such that each of the CTL1, CTL2, CTL3, and CTL4 signals has a different amount of delay relative to the IN signal. In other terms, the amount of delay of the CTL1, CTL2, CTL3, and CTL4 signals is different from one another with respect to the IN signal.

Output circuit 140 responds to the CTL1, CTL2, CTL3, and CTL4 signals and generates an output signal OUT. Output circuit 150 responds to the CTL1, CTL2, CTL3, and CTL4 signals and generates an output signal OUT*. The OUT* signal is a delayed copy of the IN signal. The OUT signal is an inverted copy of the OUT* signal. The OUT and OUT* signals form a complementary signal pair in which the OUT and OUT* signals are complimentary to each other. For example, when the OUT signal has a high signal level, the OUT* signal has a low signal level and when the OUT signal has a low signal level, the OUT* signal has a high signal level.

The CTL1, CTL2, CTL3, and CTL4 signals are grouped into two different groups. A first groups includes copies of the IN signal. A second group includes inverted copies of the IN signal. For example, the CTL1 and CTL3 may be in the first group while the CTL2 and CTL4 may be in the second group. Since each of the CTL1, CTL2, CTL3, and CTL4 signals has a delay relative to the IN signal, the signals in the first group are also delayed copies of the IN signal and the signals in the second group are also inverted and delayed copies of the IN signal. Thus, in the example above, the CTL2 and CTL4 signals are delayed copies of the IN signals; the CTL1 and CTL3 are inverted and delayed copies of the IN signal.

In some embodiments, each of the output circuits 140 and 150 includes a differential amplifier in which the differential amplifier includes an input stage with a first input side and a second input side. Each of the first and second input sides includes multiple input nodes. In these embodiments, input circuit 110 loads the first group of the staged delay control signals (e.g., CTL1 and CTL3) to the first input side of the differential amplifier of each of the output circuits 140 and 150 for an equal amount of time. Also in these embodiments, input circuit 110 loads the second group of the staged delay control signals (e.g., CTL2 and CTL4) to the second input side of the differential amplifier of each of the output circuits 140 and 150 for an equal amount of time. Based on the CTL1, CTL2, CTL3, and CTL4 signals, the differential amplifiers of generate the OUT and OUT* signals.

When input circuit 110 loads a signal to the differential amplifier, input circuit 110 holds a signal level of the signal for an amount of time. For example, when input circuit 110 loads the CTL1 signal to the first input side of the first and second differential amplifiers, input circuit 110 holds the CTL1 signal at a signal level (e.g., high) for an amount of time. Input circuit 110 stops loading the CTL1 when input circuit 110 switches the CTL1 signal to a different signal level (e.g., low). In some embodiment, input circuit 110 switches the CTL1 signal between different signals based on the frequency of the IN signal.

Figure 2:
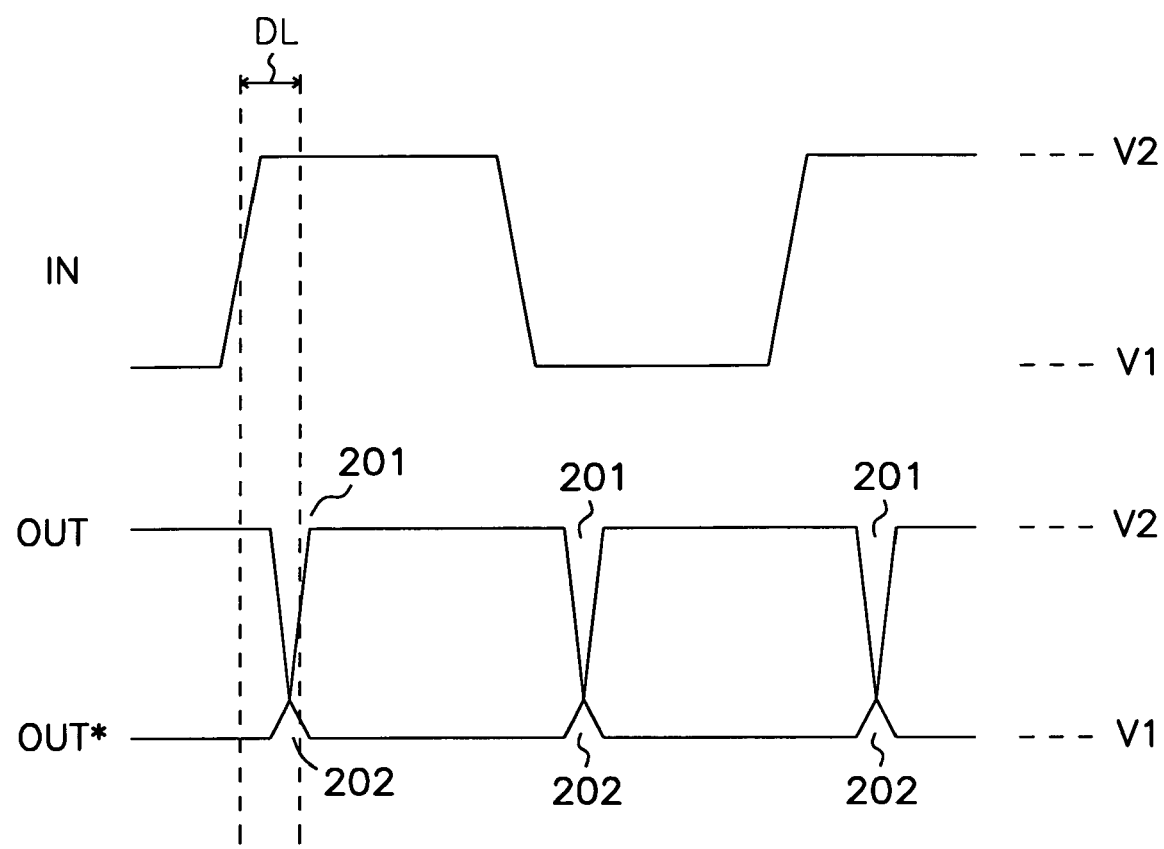
FIG. 2 is an exemplary timing diagram showing a signal relationship between an input signal and output signals of FIG. 1.

FIG. 2 is an exemplary timing diagram showing a signal relationship between the input signal and the output signals of FIG. 1. In FIG. 2, V1 and V2 are signal levels. In some embodiments, V1 and V2 correspond to voltage. FIG. 2 shows that the IN signal is a single-ended signal and has signal levels of V1 and V2. Thus, the signal swing of the IN signal is V1 and V2. The OUT* signal is a delayed copy of the IN signal. Label DL indicates the amount of delay between the IN and OUT* signal. The OUT signal is an inverted version or inverted copy of the OUT* signal.

Both of the OUT and OUT* signals also have signal levels at V1 and V2. Thus, both of the OUT and OUT* signal have the same signal swing as that of the IN signal. In some embodiments, V1 and V2 correspond to rail-to-rail voltage levels such as Vcc and ground where Vcc is the supply voltage of converter 100 of FIG. 1. Therefore, in some embodiments, the IN signal and both of the OUT and OUT* signals have a rail-to-rail signal swing.

As shown in FIG. 2, the OUT and OUT* signals form a complementary signal pair such that the OUT and OUT* signals have opposing signal levels. A gap 201 exists between the high signal levels of the OUT and OUT* signals and a gap 202 exists between the low signal levels of OUT and OUT* signals. Gaps 201 and 202 indicate that the OUT and OUT* signals are non-overlapping signals. Since the OUT and OUT* signal are complementary to each other and are non-overlapping, the OUT and OUT* are non-overlapping complementary signal pair.

Figure 3:
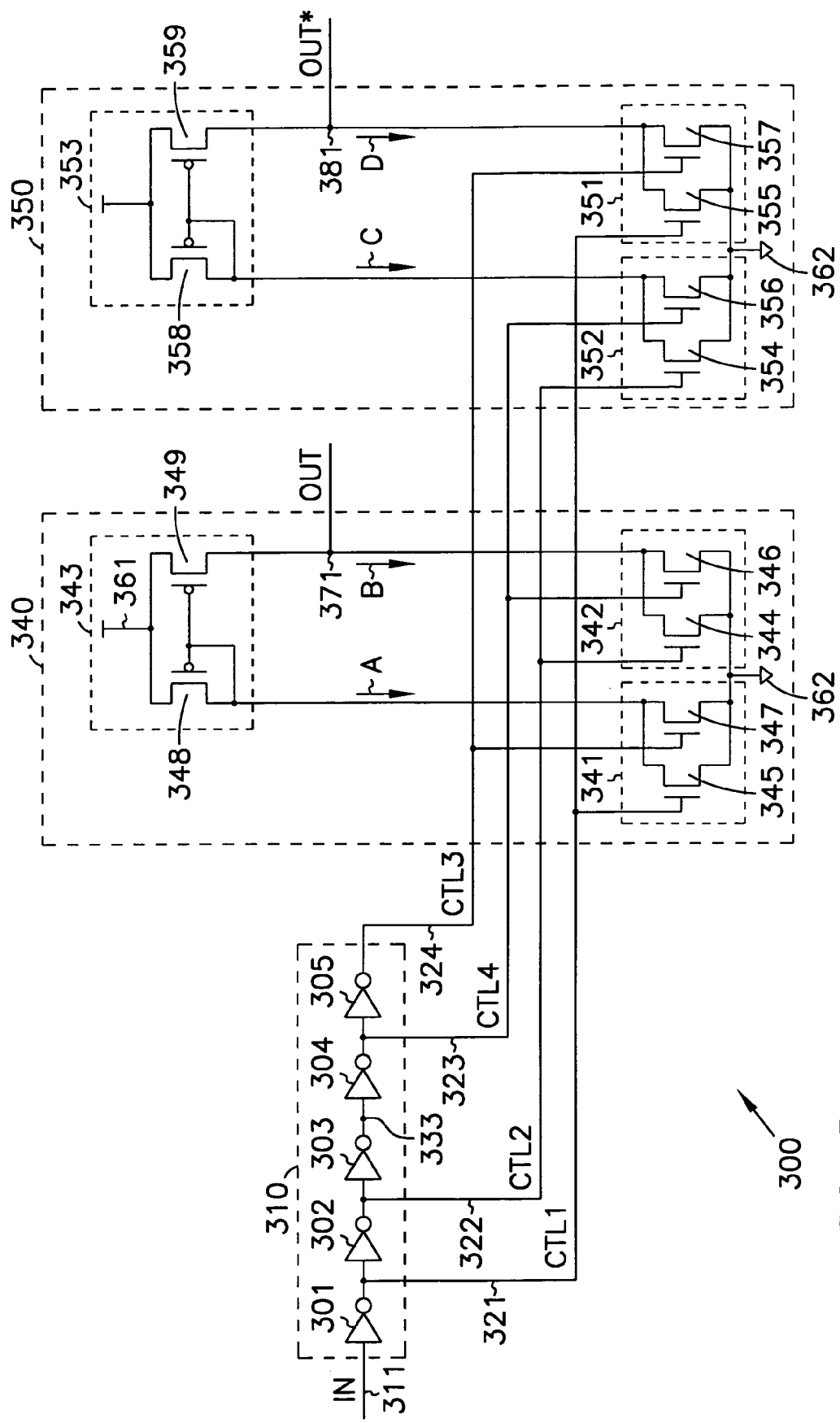
FIG. 3 shows a converter having differential amplifiers according to embodiments of the invention.

FIG. 3 shows a converter having differential amplifiers according to embodiments of the invention. Converter 300 includes an input circuit 310 and output circuits 340 and 350. Input circuit 310 receives an input signal on an input node 311 and generates staged delay control signals CTL1, CTL2, CTL3, and CTL4 at control nodes 321–324 (321, 322, 323 and 324). For simplicity, the CTL1, CTL2, CTL3, and CTL4 signals are occasionally referred together as the CTL signals. Output circuit 340 responds to the CTL signals and generates an output signal OUT at an output node 371. Output circuit 350 responds to the CTL signals and generates an output signal OUT* at an output node 381. The IN signal is a single-ended signal. The OUT and OUT* are non-overlapping complementary signal pair.

Input circuit 310 includes a number of inverters 301–305 (301, 302, 303, 304, and 305) connected in series with input node 311 and control nodes 321–324. Input circuit 310 propagates the IN signal through inverters 301–305 to generate the CTL signals. The CTL signals include different groups of staged delay control signals. The CTL1 and CTL3 signals form a first group of staged delay control signals. The CTL2 and CTL4 signals form a second group of staged delay control signals.

Each of the first and second groups has a signal on both side of a center node 333 at the center of inverters 302–305. The CLT signals are staged such that within each group, a signal from one side of center node 333 has a delayed copy on the other side of center node 333. For example, the CTL4 signal is a delayed copy of the CTL2 signal. The CTL3 signal is a delayed copy of the CTL1 signal.

As show in FIG. 3, the CTL2 and CTL4 signals are delayed copies of the IN signal. The CTL1 and CTL3 signals are delayed and inverted copies of the IN signal. The CTL signals are staged around center node 333 such that on each side of center node 333, a staged delay control signal from one group is an inverted version of a signal from the other group. For example, the CTL2 signal is the inverted version of the CTL1 signal. The CTL3 signal is the inverted version of the CTL4 signal.

Since the staged delay control signals CTL are generated from the IN signal, each of the CTL signals has a delay (relative delay) relative to the IN signal. The relative delay of each of the CTL signals is a multiple of an inverter delay. The inverter delay is a delay of one of the inverters 301–305. For example, the CTL1 signal has one inverter delay relative to the IN signal. The CTL2 signal has two inverter delay relative to the IN signal. Thus, each of the CTL signals have a different delay relative to the IN signal. In other terms, the amount of delay of the CTL signals is different from one another with respect to the IN signal.

The differences in the delays of the CTL signals relative to the IN signal in allow input circuit 310 to control the signal levels and the timing of the OUT and OUT* signals of output circuits 340 and 350.

Output circuit 340 includes switching units 341 and 342, and a current source 343. Current source 343 includes transistors 348 and 349 forming a current mirror with a first leg connected to switching unit 341 and a second leg connected to switching unit 342. Switching unit 341 includes a pair of transistors 345 and 347 connected in parallel between current source 343 and a supply node 362. Switching unit 342 includes a pair of transistors 344 and 346 connected in parallel between current source 343 and supply node 362.

Switching units 341 and 342, and current source 343 form a differential amplifier with output node 371 being the output node of the differential amplifier to provide the OUT signal. Switching unit 341 forms a first input side of the differential amplifier. Switching unit 342 forms a second input side of the differential amplifier. The combination of switching units 341 and 342 forms an input stage of the differential amplifier to receive the CTL signals to produce the OUT signal.

Output circuit 350 includes switching units 351 and 352, and a current source 353. Current source 353 includes transistors 358 and 359, forming a current mirror with a first leg connected to switching unit 351 and a second leg connected to switching unit 352. Switching unit 351 includes a pair of transistors 355 and 357 connected in parallel between current source 353 and supply node 362. Switching unit 352 includes a pair of transistors 354 and 356 connected in parallel between current source 353 and supply node 362.

Switching units 351 and 352, and current source 353 form a differential amplifier with output node 381 being the output node of the differential amplifier to provide the OUT* signal. Switching unit 351 forms a first input side of the differential amplifier. Switching unit 352 forms a second input side of the differential amplifier. The combination of switching units 351 and 352 forms an input stage of the differential amplifier to receive the CTL signals to produce the OUT* signal.

During operation, output circuit 340 switches the OUT signal between different signal levels in response to the CTL signals. Output circuit 350 switches the OUT* signal between different signals levels but in an opposite direction from that of the OUT signal. For example, output circuit 340 switches the OUT signal from low to high while output circuit 350 switches the OUT* signal from high to low.

Output circuits 340 and 350 simultaneously receive the CTL signals to control the signal levels of the OUT and OUT* signal such that the OUT and OUT* signals form a complementary signal pair and the OUT and OUT* signals are non-overlapping. In some embodiments, the OUT and OUT* signals are non-overlapping such that the high signal level of the OUT signal does not overlap the high signal level of the OUT* signal. In other terms, the OUT and OUT* signals do not simultaneously have a high signal level.

The signal level of the OUT signal depends on the current in current paths A and B of output circuit 340. The signal level of the OUT* signal depends on the current in current paths C and D of output circuit 350.

Output circuit 340 controls the current in current paths A and B by controlling the gates of transistors in 345 and 347 with the CTL1 and CTL3 signals and by controlling the gate of transistors 344 and 346 with the CTL2 and CTL4 signals. Similarly, output circuit 350 controls the current in current paths C and D by controlling the gates of transistors in 355 and 357 with the CTL1 and CTL3 signals and by controlling the gate of transistors 354 and 356 with the CTL2 and CTL4 signals.

Input circuit 310 loads the gates of the transistors of output circuits 340 and 350 in a sequential manner to enable output circuits 340 and 350 to control the current in current paths A, B, C, and D such that OUT and OUT* signals are non-overlapping and form a complementary signal pair.

At a first time interval, input circuit 310 simultaneously loads the CTL1 signal to the gates of transistor 345 and 355 for an equal amount of time or an equal loading time. At a second time interval, input circuit 310 simultaneously loads the CTL2 signal to the gates of transistor 344 and 354 for an equal amount of time or an equal loading time. At a third time interval, input circuit 310 simultaneously loads the CTL4 signal to the gates of transistor 346 and 356 for an equal amount of time or an equal loading time. At a fourth time interval, input circuit 310 simultaneously loads the CTL3 to the gates of transistor 347 and 357 for an equal amount of time or an equal loading time.

In FIG. 3, the operating principle is configuring input circuit 310 such that the original version IN signal (at node 311) and the inverted version of the IN signal (the signal at node 321) load the input nodes of output circuits 340 and 350 simultaneously for an equal amount of time. Equal loading of the original and inverted versions of the IN signal to the input nodes of output circuits 340 and 350 allows output circuits 340 and 350 to generate the OUT and OUT* signals in which the OUT and OUT* signals are non-overlapping and complementary to each other.

Input circuit 310 is configured with a series of inverters to interpolate the delay introduced by the inversion of the IN signal (delay introduced by inverter 301) on four inverter delay (302, 303, 304, and 305) to produce the CTL signals. The CTL signals allow equal loading of the output circuits 340 and 350. As described above, selected signal of the CTL signals (CTL1, CTL2, CTL3, and CTL4) is simultaneously loaded to output circuits 340 and 350 such that output circuits 340 and 350 experience equal loading from each of the CTL signals. As a result, from the output circuits 340 and 350 point of view, the CTL signals are simultaneously loaded the input nodes of output circuits 340 and 350 with respect to center node 333.

Since the CTL signals are resulted from the interpolation of the delay introduced to the IN signal by inverter 301, loading the CTL signals for an equal amount of time to output circuits 340 and 350 is equivalent to loading the original version of IN signal and the inverted version of the IN signal to output circuits 340 and 350 for an equal amount of time. Thus, using input circuit 310 to interpolate the delay introduced to the single-ended input signal IN allows equal loading of output circuits 340 and 350 with the original and inverted versions of the IN signal; as a result, output circuits 340 and 350 is able to generate dual non-overlapping and complimentary output signals OUT and OUT* based on the single-ended input signal IN.

The interpolating technique described above allows converter 300 of FIG. 3 to perform a conversion of a single-ended input signal to dual non-overlapping and complementary output signals at high speed. In some embodiments, converter 300 produces the OUT and OUT* signals at a speed between five and ten gigahertz (5 GHz to 10 Ghz). Thus, in some embodiments, the IN signal has a frequency between 5 GHz to 10 Ghz and the OUT and OUT* signals also have a frequency between 5 GHz to 10 Ghz.

Converter 300 of FIG. 3 may be formed with an equivalent circuit to serve the same purpose. For example, converter 300 may be formed with the following changes: the transistors in switching units 341, 342, 351, and 352 may be formed with p-type (p-channel) transistors instead of n-type (n-channel); node 362 may be connected to a supply voltage (e.g., Vcc) instead of ground; the transistors of current sources 343 and 353 may be formed with n-type transistors instead of p-type transistors; and node 361 may be connected to ground.

Figure 4A:
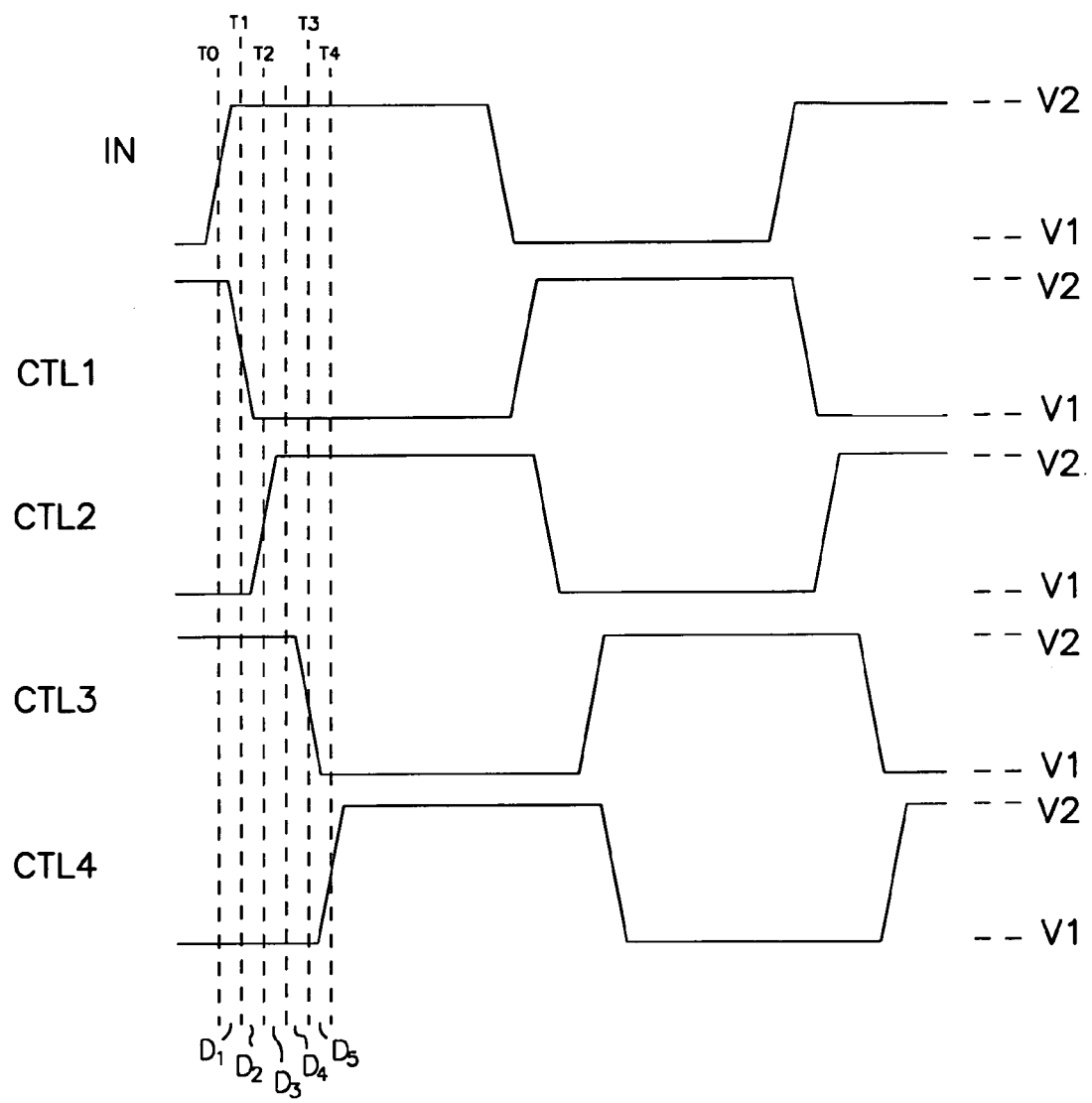
FIG. 4A is an exemplary timing diagrams showing signal relationships between an input signal and each of the staged delay control signals of FIG. 3.

FIG. 4A is an exemplary timing diagrams showing signal relationships between the input signal and each of the staged delay control signals of FIG. 3. In FIG. 4A, T0 through T4 represent times; V1 and V2 are signal levels. The IN signal and the CTL signals have the same signal swing between V1 and V2. In some embodiments, V1 and V2 correspond to voltage levels. In some embodiments, V1 and V2 correspond to rail-to-rail voltage levels such as Vcc and ground, where Vcc is a supply voltage of converter 300 of FIG. 3. Therefore, in some embodiments, the IN signal and the CTL signals have a rail-to-rail signal swing.

Each of the labels $D_1$, $D_2$, $D_3$, $D_4$, $D_5$ in FIG. 4A represents a fixed delay (time delay). The delays $D_1$, $D_2$, $D_3$, $D_4$, and $D_5$ in FIG. 4A correspond to the delays of inverters 301–305, respectively, of FIG. 3. As shown in FIG. 4, each of the CTL signals has a delay relative to the IN signal. Since each of the $D_1$, $D_2$, $D_3$, $D_4$, and $D_5$ is the delay of an inverter such as each of the inverters 301–305, each of the CTL signals has a delay equal to a multiple of the delay of an inverter relative to the IN signal. For example, the CTL1 signal has a delay equal to one-inverter delay (D1) relative to the IN signal; the CTL2 signal has a delay equal to two-inverter delay ($D_1$ and $D_2$) relative to the IN signal. FIG. 4A shows that the delay between the CTL2 and CTL4 signal is two-inverter delay ($D_3$ and $D_4$) and the delay between the CTL1 and CTL3 signals is four-inverter delay ($D_2$, $D_3$, $D_4$, and $D_5$). Thus, the delay between the CTL2 and CTL4 signals is less than the delay between the CTL1 and CTL3 signals.

The combination of different (unequal) delay of the staged delay control signals CTL relative to the IN signal allows output circuits 340 and 350 to generate a non-overlapping and complementary OUT and OUT* signals.

Figure 4B:
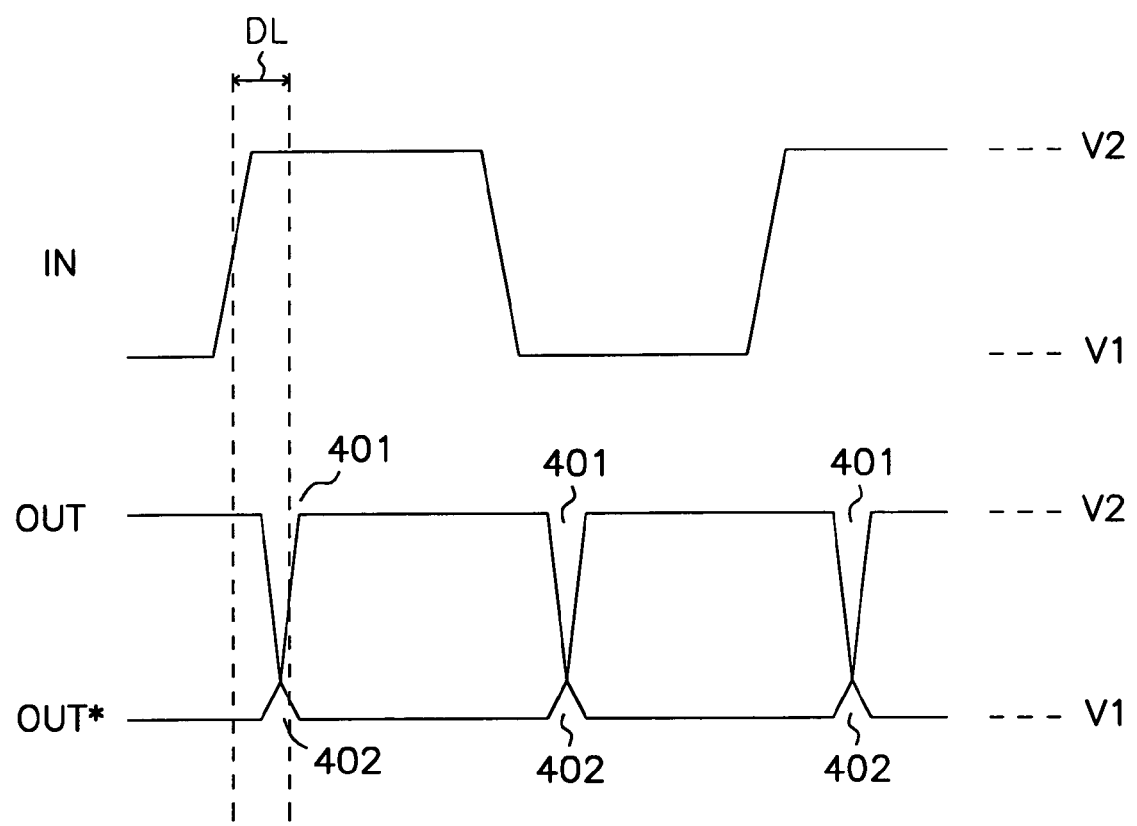
FIG. 4B is an exemplary timing diagrams showing a signal relationship between an input signal and output signals of FIG. 3.

FIG. 4B is an exemplary timing diagrams showing a signal relationship between an input signal and the output signals of FIG. 3. In FIG. 4B, V1 and V2 are signal levels. In some embodiments, V1 and V2 correspond to voltage levels. FIG. 4B shows that the IN signal is a single-ended signal and has signal levels of V1 and V2. Thus, the signal swing of the IN signal is V1 and V2. FIG. 4B shows that the OUT* signal is a delayed copy of the IN signal and the OUT signal is an inverted version or inverted copy of the OUT* signal. Label DL in FIG. 4B indicates the amount of delay between the IN and OUT* signals.

FIG. 4B also shows that both of the OUT and OUT* signals also have signal levels at V1 and V2. Thus, both of the OUT and OUT* signal have the same signal swing as that of the IN signal. In some embodiments, V1 and V2 correspond to rail-to-rail voltage levels such as Vcc and ground, where Vcc is a supply voltage of converter 300 of FIG. 3. Therefore, in some embodiments, the IN signal and both of the OUT and OUT* signals have a rail-to-rail signal swing.

FIG. 4B shows that OUT and OUT* signals form a complementary signal pair such that the OUT and OUT* signals have opposing signal levels. A gap 401 exists between the high signal levels of the OUT and OUT* signals and a gap 402 exists between the low signal levels of OUT and OUT* signals. Gaps 401 and 402 indicate that the OUT and OUT* signals are non-overlapping signals. Since the OUT and OUT* signal are complementary to each other and are non-overlapping, the OUT and OUT* are non-overlapping complementary signal pair.

In FIG. 4, the IN signal and the OUT and OUT* signal may have a duty cycle different from 50 percent duty cycle.

Figure 5:
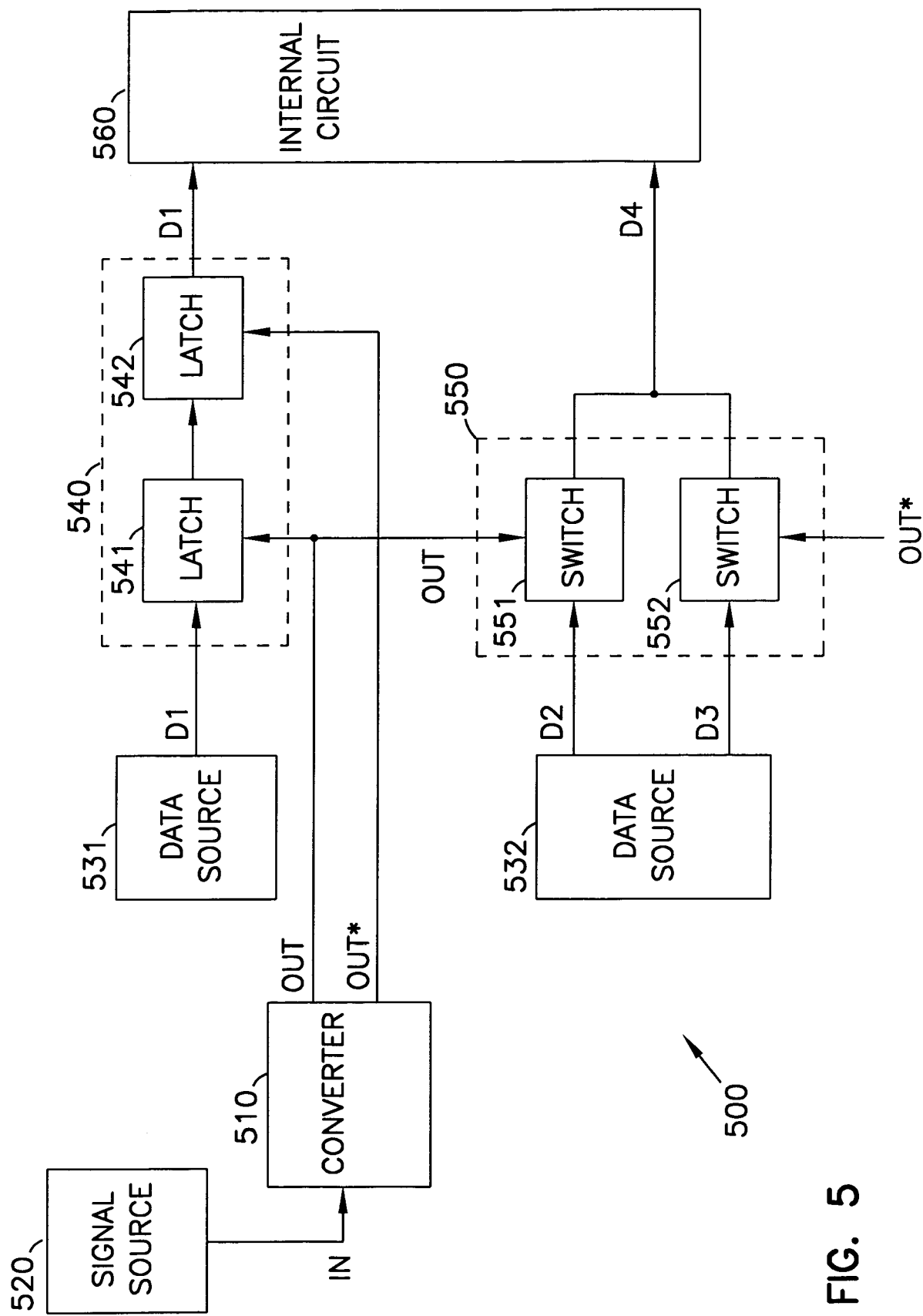
FIG. 5 shows an integrated circuit according to embodiments of the invention.

FIG. 5 shows an integrated circuit according to embodiments of the invention. Integrated circuit 500 includes a converter 510, a signal source 520, data sources 531 and 532, a latch circuit 540, a select circuit 550, and an internal circuit 560. Converter 510 includes embodiments of converter 100 of FIG. 1 and converter 300 of FIG. 3.

In FIG. 5, converter 510 receives an input signal IN from signal source 520 and provides output signals OUT and OUT* to latch circuit 540 and select circuit 550. The OUT and OUT* signals in FIG. 5 are non-overlapping complimentary signal pair similar to the OUT and OUT* signals described in FIG. 1 through FIG. 4.

In FIG. 5, latch circuit 540 uses the OUT and OUT* signal to pass a signal D1 from data source 531 to internal circuit 560. Latch circuit 540 includes latches 541 and 542. In some embodiments, latches 541 and 542 form a master and slave network to sequentially pass the D1 signal from data source to internal circuit 560. For example, latch circuit 540 passes the D1 signal to latch 541 when the OUT signal is high and the OUT* signal is low. Subsequently, latch circuit 540 passes the D1 signal from latch 541 to internal circuit 560 via latch 542 when the OUT signal is low and the OUT* signal is high.

Select circuit 550 uses the OUT and OUT* signal to select either the D2 and D3 signal from data source 532 and passes the selected signal to internal circuit 560. D4 at the output of select circuit 550 represents the selected signal, which is either the D1 or D2 signal. Select circuit 550 includes switches 551 and 552. In some embodiments, each of the switches 551 and 552 includes a pass gate having control nodes controlled by the OUT and OUT* signals to pass either the D2 or D3 signal to internal circuit 560. For example, when the OUT signal is high and the OUT* signal is low, select circuit 550 selects the D2 signal and passes the D2 signal to internal circuit 560 via switch 551. As another example, when the OUT signal is low and the OUT* signal is high, select circuit 550 selects the D3 signal and passes the D3 signal to internal circuit 560 via switch 552. Internal circuit 560 receives the D1 and D4 signal for further processing. In some embodiments, signal source 520 includes a clock generator such that the IN signal is a clock signal.

In FIG. 5, latch circuit 540 and select circuit 550 receive the OUT and OUT* signals from the same converter 510. In some embodiments, each of the latch circuit 540 and select circuit 550 receives the OUT and OUT* signals from a separate converter.

Figure 6:
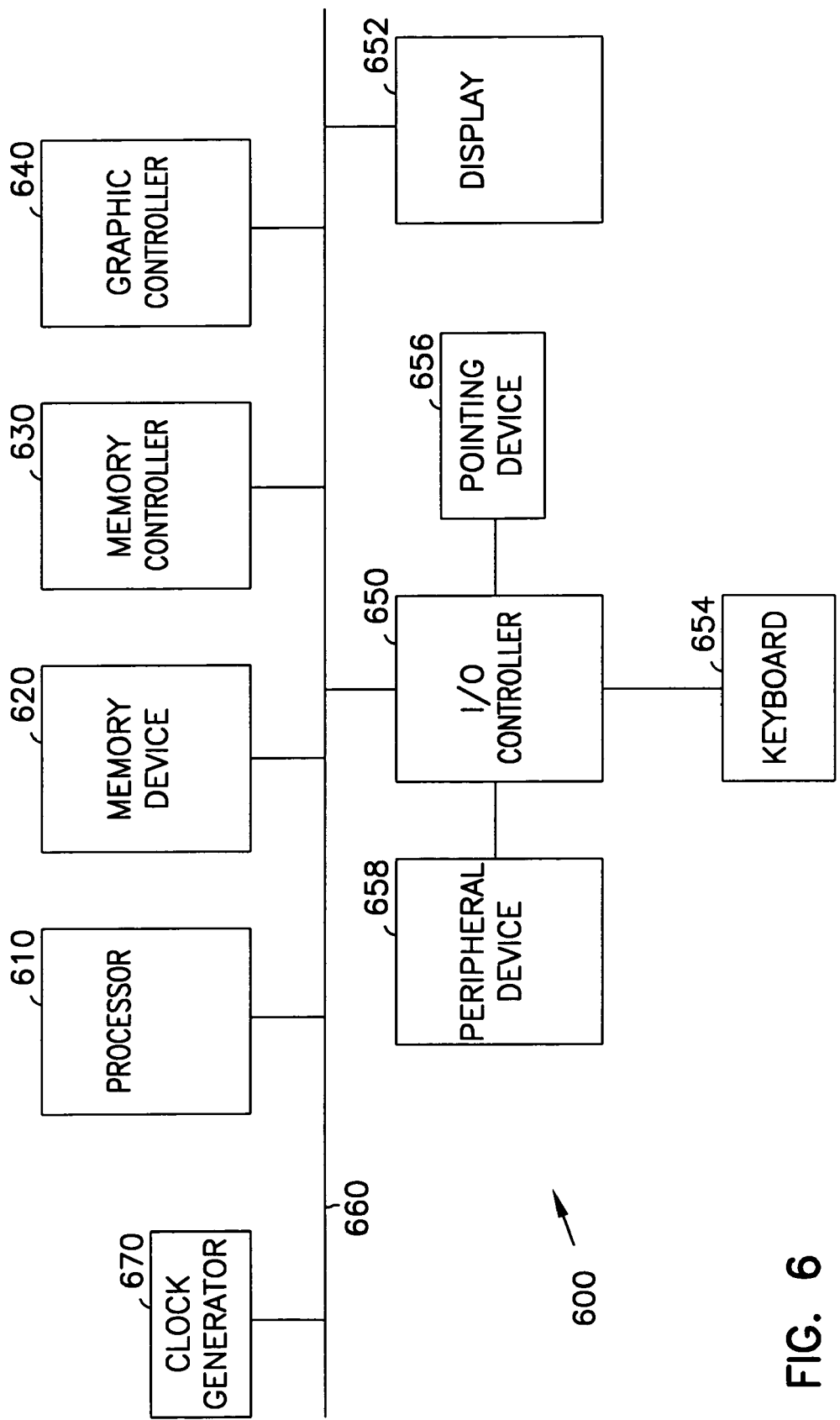
FIG. 6 shows a system according to embodiments of the invention.

FIG. 6 shows a system according to embodiments of the invention. System 600 includes processing unit or processor 610, a memory device 620, a memory controller 630, a graphic controller 640, an input and output (I/O) controller 650, a display 652, a keyboard 654, a pointing device 656, and a peripheral device 658. A bus 660 connects all of these devices together. A clock circuit 670 provides an external clock signal to at least one of the devices of system 600. In some embodiments, system 600 may omit one or more devices shown in FIG. 6. In some embodiments, two or more devices shown in system 600 may be formed in a single chip.

Bus 660 may be conducting traces on a circuit board or may be one or more cables. Bus 660 may also connect the devices of system 600 by wireless means such as electromagnetic radiation (e.g., radio waves). Peripheral device 658 may be a printer, an optical device (e.g., a compact disc read only memory (CD-ROM) device or a digital video disc (DVD) device), a magnetic device (e.g., floppy disk driver), or an audio device (e.g., a microphone). Memory device 620 may comprise a dynamic random access memory (DRAM) device, a static random access memory (SRAM) device, a flash memory device, or a combination thereof.

At least one of the devices shown in system 600 includes embodiments of FIG. 1 through FIG. 5. Thus, at least one of the devices shown in system 600 includes embodiments of a converter such as converter 100 or converter 300 described in FIG. 1 through FIG. 5 in which the converter generates a non-overlapping complementary signal pair based on a single-ended input signal. Further, at least one of the devices shown in system 600 includes embodiments of an integrated circuit such as integrated circuit 500 of FIG. 5 in which the integrated circuit uses a non-overlapping complementary signal pair to control a transfer of data among different circuits of the integrated circuit.

System 600 of FIG. 6 may take the form of computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 4) players, video games, watches, etc.), and the like.

Figure 7:
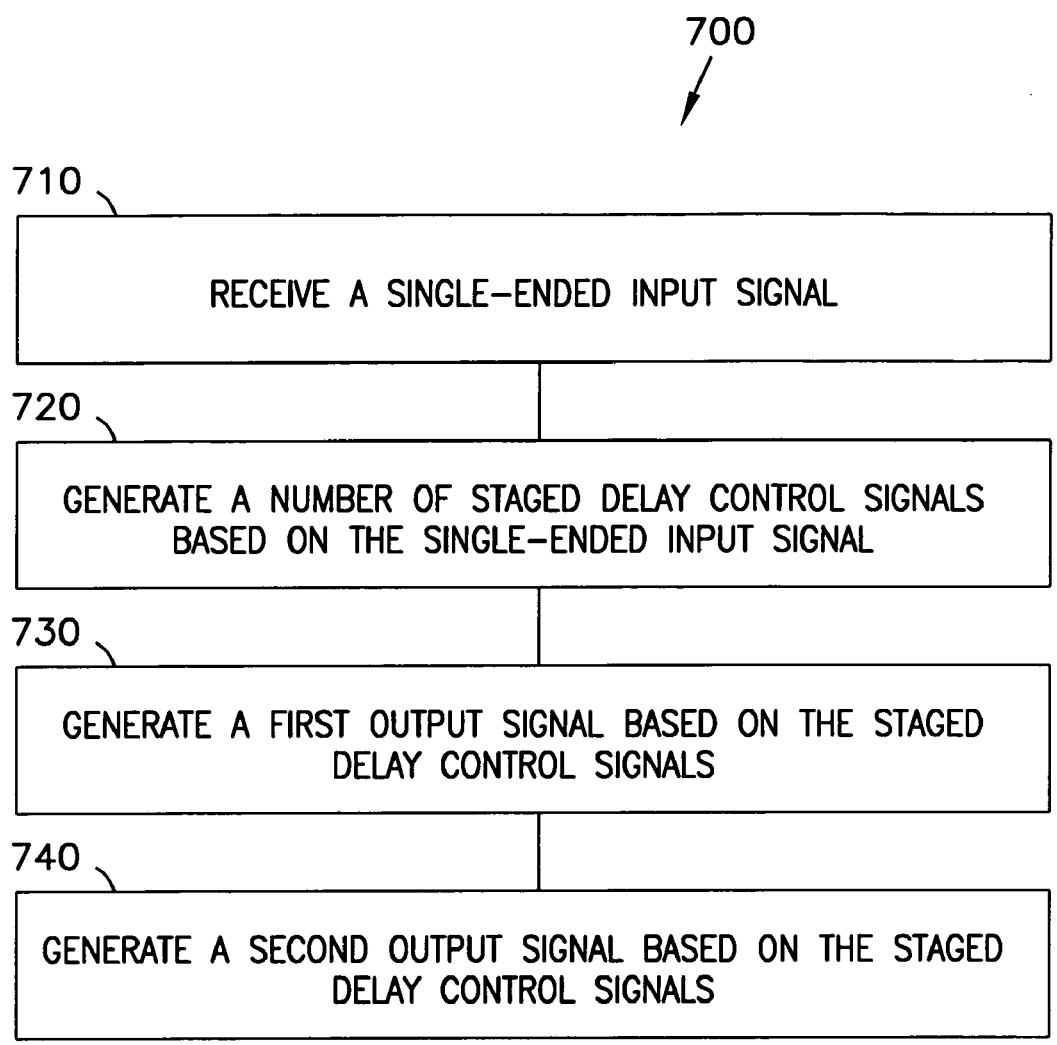
FIG. 7 is a flowchart of a method of generating signals according to embodiments of the invention.

FIG. 7 is a flowchart of a method of generating signals according to embodiments of the invention. Method 700 generates non-overlapping and complementary signal pair based on a single-ended input signal.

Box 710 receives an input signal. In some embodiments, the input signal is single-ended clock signal.

Box 720 generates a number of staged delay control signals based on the input signal. Each of the staged delay control signals has a fixed timing relationship with the input signal. For example, each of the staged delay control signals has a fixed delay relative to the input signal. The staged delay control signals are groups into a first group of staged delay control signals and a second group of staged delay control signals. The first group of staged delay control signals includes inverted copies of the input signal, in which the amount of delay of the inverted copies is different from one another relative to the input signal. The second group of staged delay control signals includes delayed copies of the input signal, in which the amount of delay of the delayed copies is different from one another relative to the input signal. In some embodiments, box 720 propagates the input signal through an odd number of inverters connected in series to generate the staged delay control signals such that the fixed relative delay of each staged delay control signal is a multiple of an inverter delay.

In embodiments where the odd number of series-connected inverter are used, the first group of staged delay control signals includes a signal at the output of the first inverter in the series and a signal at the output of the last inverter in the series. Also in these embodiments, the second group of staged delay control signals includes signals at the output of the inverters located between the first and last inverters in the series.

The input signal and the staged delay control signals are similar to the IN and CTL signals described in FIG. 1 through FIG. 6. In some embodiments, box 720 uses an input circuit such as input circuit 110 of FIG. 1 or input circuit 310 of FIG. 3 to receive the input signal and to generate the staged delay control signals.

Box 730 generates a first output signal. In some embodiments, the first output signal and the input signal have an equal signal swing. For example, both of the input signal and the first output signal have a low signal level of V1 and a high signal level of V2, where V1 and V2 are voltage levels. In some embodiments, V1 and V2 are rail-to-rail voltage levels such as supply voltage level (e.g., Vcc) and ground.

In some embodiments, box 730 loads a first input side of an input stage of a first differential amplifier with the first group of staged delay control signals (e.g., the CTL1 and CTL3 signals) to control a first pair of parallel transistors in a first current path of the first differential amplifier. Box 730 also loads a second side of the input stage of the first differential amplifier with the second group of staged delay control signals (e.g., the CTL2 and CTL4 signals) to control a second pair of parallel transistors in a second current path of the first differential amplifier. The current in the first and second current paths of the first differential amplifier controls the signal level of the first output signal. In some embodiments, box 730 uses a different amplifier such as the differential amplifier of output circuit 340 of FIG. 3 to generate the first output signal.

Box 740 generates a second output signal. In some embodiments, the second and the input signal have an equal signal swing. In some embodiments, V1 and V2 are rail-to-rail voltage levels such supply voltage level (e.g., Vcc) and ground. In some embodiments, box 740 loads a first input side of an input stage of a second differential amplifier with the first group of staged delay control signals to control a first pair of parallel transistors in a first current path of the second differential amplifier. Box 730 also loads a second side of the input stage of the second differential amplifier with the second group of staged delay control signals to control a second pair of parallel transistors in a second current path of the second differential amplifier. The current in the first and second current paths of the second differential amplifier controls the signal level of the second output signal. In some embodiments, box 740 uses a different amplifier such as the differential amplifier of output circuit 350 of FIG. 3 to generate the second output signal.

In box 730 and box 740, the first group of staged delay control signals is simultaneously loaded to the first input side of the input stages of the first and second differential amplifiers. The first group of staged delay control signals is loaded such that the first group of staged delay control signals controls the first input side of the input stages of the first and second differential amplifiers for an equal amount of time.

Similarly, in box 730 and box 740, the second group of staged delay control signals is simultaneously loaded to the second side of the input stages of the first and second differential amplifiers. The second group of staged delay control signals is loaded such that the second group of staged delay control signals controls the second side of the input stages of the first and second differential amplifiers for an equal amount of time.

The first and second output signals generated in boxes 730 and 740 form a non-overlapping complementary signal pair such as the OUT and OUT* signal described in FIG. 1 through FIG. 6.

In the description of FIG. 1 through FIG. 7, portions and features of the converter or the devices in some embodiments may be included in or substituted for those of other embodiments.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A device comprising:
   an input node to receive a single-ended input signal;
   an input circuit to produce a plurality of staged delay control signals in response to the single-ended signal, the staged delay control signals having a delay different from one another relative to the single-ended input signal;
   a first differential amplifier to receive the staged control signals to generate a first output signal which is a delayed copy of the single-ended input signal; and
   a second differential amplifier to receive the staged control signals to generate a second output signal which is an inverted copy of the first output signal.

2. The device of claim 1, wherein the input circuit includes a plurality of inverters coupled in series with the input node, and wherein each of the staged delay control signals is produced by one of the inverters.

3. The device of claim 2, wherein a total number of the plurality of inverters is an odd number of inverters.

4. The device of claim 1, wherein the first differential amplifier includes a first input side having multiple input nodes to receive a first group of the staged delay control signals to influence a signal level of the first output signal and a second input side having multiple input nodes to receive a second group of the staged delay control signals to influence the signal level of the first output signal.

5. The device of claim 4, wherein the second differential amplifier includes a first input side having multiple input nodes to receive the first group of the staged delay control signals to influence a signal level of the second output signal and a second input side having multiple input nodes to receive the second group of the staged delay control signals to influence the signal level of the second output signal.

6. The device of claim 5, wherein the input circuit is configured to load the first group of the staged delay control signals to both the first input side of the first differential amplifier and the first input side of the second differential amplifier for an equal amount of time.

7. The device of claim 6, wherein the input circuit is configured to load the second group of the staged delay control signals to both the second input side of the first differential amplifier and the second input side of the second differential amplifier for an equal amount of time.

8. The device of claim 1, wherein each of the first and second differential amplifiers includes a first input side and a second input side, and wherein each of the first and second input sides includes a first transistor and a second transistor coupled in parallel with a second transistor, the first transistor including a gate to receive a first signal, the second transistor including a gate to receive a delayed copy of the first signal, wherein the first signal and the delayed copy of the first signals are two of the staged delay control signals.

9. The device of claim 1, wherein each of the first and second differential amplifiers includes:
an output node to provide one of the first and second output signals;
a current mirror;
a first switching unit coupled to the current source to control an amount of current flowing through the output node based on a first group of the staged delay control signals; and
a second switching unit coupled to the current source and in parallel with the first switching unit to control the amount of current flowing through the output node based on a second group of the staged delay control signals.

10. The device of claim 9, wherein the input signal and the first and second output signals have an equal signal swing.

11. The device of claim 1, wherein the output circuits are configured to produce the first and second output signals at a frequency between five gigahertz and ten gigahertz.

12. A device comprising:
an input circuit to receive an input signal to generate a number of staged delay control signals, the staged delay control signals have a delay different from one another relative to the input signal;
a first output circuit and a second output circuit to receive the staged delay control signals, the first output circuit including an output node to produce a first output signal, the second output circuit including an output node to produce a second output signal non-overlapping with the first output signal, each of the first and second output circuits including:
a current source including a current mirror coupled to a first supply node and an output node; and
a first switching unit and second switching unit coupled in parallel between the current source and a second supply node, each of the first and second switching units including multiple switching control nodes responsive to the staged delay control signals.

13. The device of claim 12, wherein each of the first and second switching unit includes:
a first transistor including a gate coupled to a first switching control node of the multiple switching control nodes; and
a second transistor coupled in parallel with the first transistor between the current source and the second supply node, the second transistor including a gate coupled to a second switching control node of the multiple switching control nodes, wherein the first switching control node is different from the second switching control node.

14. A device comprising:
an input circuit to receive an input signal to generate a number of staged delay control signals, the staged delay control signals have a delay different from one another relative to the input signal, wherein the input circuit includes:
a first inverter coupled between an input node of the input circuit and the gate of the first transistor of the first switching circuit of each of the first and second output circuits;
a second inverter coupled between the first inverter and gate of the first transistor of the second switching circuit of each of the first and second output circuits;
an even number of middle inverters coupled between the second inverter and gate of the second transistor of the second switching circuit of each of the first and second output circuits; and
a third inverter coupled between the middle inverters and gate of the second transistor of the first switching circuit of each of the first and second output circuits; and
a first output circuit and a second output circuit to receive the staged delay control signals, the first output circuit including an output node to produce a first output signal, the second output circuit including an output node to produce a second output signal non-overlapping with the first output signal, each of the first and second output circuits including:
a current source coupled to a first supply node and an output node; and
a first switching unit and second switching unit coupled in parallel between the current source and a second supply node, each of the first and second switching units including multiple switching control nodes responsive to the staged delay control signals and including a first transistor including a gate coupled to a first switching control node of the multiple switching control nodes, and a second transistor coupled in parallel with the first transistor between the current source and the second supply node, the second transistor including a gate coupled to a second switching control node of the multiple switching control nodes.

15. A device comprising:
an input circuit to receive an input signal to generate a number of staged delay control signals, the staged delay control signals have a delay different from one another relative to the input signal;
a first output circuit and a second output circuit to receive the staged delay control signals, the first output circuit including an output node to produce a first output signal, the second output circuit including an output node to produce a second output signal non-overlapping with the first output signal, each of the first and second output circuits including:
a current source coupled to a first supply node and an output node and including a first transistor including a gate and a drain coupled to the first switching circuit and a source coupled to the first supply node, and a second transistor including a source coupled to the first supply node, a drain coupled to the output node, and a gate coupled to the gate of the first transistor; and
a first switching unit and second switching unit coupled in parallel between the current source and a second supply node, each of the first and second switching units including multiple switching control nodes responsive to the staged delay control signals and including a first transistor including a gate coupled to a first switching control node of the multiple switching control nodes, and a second transistor coupled in parallel with the first transistor between the current source and the second supply node, the second transistor including a gate coupled to a second switching control node of the multiple switching control nodes.

16. The device of claim 15, wherein the input circuit includes a plurality of inverters coupled in series with an input node of the input circuit, wherein a total number of the plurality of inverters is an odd number.

17. A device comprising:

a converter including an input circuit to receive an input signal to generate a number of staged delay control signals, the staged delay control signals have a delay different from one another relative to the single-ended input signal, a first output circuit responsive to the staged delay control signals to generate a first output signal, and a second output circuit responsive to the staged delay control signals to generate a second output signal non-overlapping with the first output signal, wherein at least one of the first and second output circuit includes a differential amplifier responsive to the staged delay control signals; and an additional circuit responsive to the first and second output signals of the first and second output circuits.

18. A device comprising:

a converter including an input circuit to receive an input signal to generate a number of staged delay control signals, the staged delay control signals have a delay different from one another relative to the single-ended input signal, a first output circuit responsive to the staged delay control signals to generate a first output signal, and a second output circuit responsive to the staged delay control signals to generate a second output signal non-overlapping with the first output signal; and an additional circuit responsive to the first and second output signals of the first and second output circuits wherein the additional circuit includes an input node, and an output node, and a first latch and a second latch coupled in series between the input node and the output node to pass a signal from the input node to the output node based on the first and second output signals of the first and second output circuits.

19. A device comprising:

a converter including an input circuit to receive an input signal to generate a number of staged delay control signals, the staged delay control signals have a delay different from one another relative to the single-ended input signal, a first output circuit responsive to the staged delay control signals to generate a first output signal, and a second output circuit responsive to the staged delay control signals to generate a second output signal non-overlapping with the first output signal; and an additional circuit responsive to the first and second output signals of the first and second output circuits, wherein the additional circuit includes a number of input nodes, and an output node, and a selector to selectively pass a signal from one of the input nodes to the output node based on the first and second output signals of the first and second output circuits.

20. A device comprising:

a converter including an input circuit to receive an input signal to generate a number of staged delay control signals, the staged delay control signals have a delay different from one another relative to the single-ended input signal, a first output circuit responsive to the staged delay control signals to generate a first output signal, and a second output circuit responsive to the staged delay control signals to generate a second output signal non-overlapping with the first output signal, wherein each of the first and second output circuits includes:

a current source coupled to a first supply node and an output node; and a first pair of parallel transistors coupled between the current source and a second supply node; and a second pair of parallel transistors coupled between the current source and the second supply node; and an additional circuit responsive to the first and second output signals of the first and second output circuits.

21. A method comprising:

receiving an input signal;

generating a plurality of first staged delay control signals, each of the first staged delay control signals being an inverted copy the input signal, and each of the first staged delay control signals having a delay relative to the input signal;

generating a plurality of second staged delay control signals, each of the second staged delay control signals being a copy of the input signal, and each of the second staged delay control signal having a delay relative to the input signal;

generating a first output signal based the first staged delay control signals and the second staged delay control signals; and generating a second output signal based on first staged delay control signals and the second staged delay control signals, wherein the first and second output signals form a non-overlapping complementary signal pair.

22. The method of claim 21, wherein the delay relative to the input signal of each of the first staged delay control signals is different from the delay relative to the input signal of each of the second staged delay control signals.

23. The method of claim 21, wherein the delay relative to the input signal of each of the first and second staged delay control signals is equal to a multiple of a delay of an inverter.

24. The method of claim 21, wherein generating the plurality of first staged delay control signals includes propagating the input signal through an odd number of inverters coupled in series.

25. The method of claim 24, wherein generating the plurality of second staged delay control signals includes propagating the input signal through an even number of inverters among the odd number of the inverters, and wherein the each of the second staged delay control signals is generated at an output node of one of the inverters within the even number of inverters.

26. The method of claim 21, wherein generating the first output signal and the second output signal includes:

simultaneously loading a first input node of a first input side of a first differential amplifier and a first input node of a first input side of second differential amplifier with one of the first staged delay control signals at a first time;

simultaneously loading a first input node of a second input side of the first differential amplifier and a first input node of a second input side of the second differential amplifier with one of the second staged delay control signals at a second time;

simultaneously loading a second input node of the second input side of the first, differential amplifier and a second input node of the second input side of the second differential amplifier with another one of the second staged delay control signals at a third time; and simultaneously loading a second input node of the first input side of the first differential amplifier and a second input node of the first input side of the second differential amplifier with another one of the first staged delay control signals at a fourth time.

27. The method of claim 26, wherein the input signal and the first and second output signals have an equal signal swing.

* * * * *

UNITED STATES PATENT AND TRADEMARK OFFICE
CERTIFICATE OF CORRECTION

| | |
|---|---|
| PATENT NO. | : 7,199,665 B2 |
| APPLICATION NO. | : 10/954127 |
| DATED | : April 3, 2007 |
| INVENTOR(S) | : Paillet et al. |

It is certified that error appears in the above-identified patent and that said Letters Patent is hereby corrected as shown below:

In column 13, line 26, in Claim 18, after "circuits" insert -- , --.

In column 14, line 5, in Claim 21, after "copy" insert -- of --.

In column 14, line 14, in Claim 21, after "based" insert -- on --.

In column 14, line 54, in Claim 26, after "first" delete ",".

Signed and Sealed this

Third Day of July, 2007

JON W. DUDAS
*Director of the United States Patent and Trademark Office*